United States Patent
Creek et al.

(10) Patent No.: US 6,703,825 B1
(45) Date of Patent: *Mar. 9, 2004

(54) SEPARATING DEVICE RESPONSE SIGNALS FROM COMPOSITE SIGNALS

(75) Inventors: William R. Creek, Fremont, CA (US); Mark Deome, San Jose, CA (US); R. Warren Necoechea, Fremont, CA (US)

(73) Assignee: LTX Corporation, Westwood, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/356,172

(22) Filed: Jan. 31, 2003

Related U.S. Application Data (62) Division of application No. 09/639,517, filed on Aug. 15, 2000, now Pat. No. 6,563,298.

(51) Int. Cl.⁷ .......................... G01R 31/28; G01R 31/26
(52) U.S. Cl. ...................................... 324/158.1; 324/765
(58) Field of Search .............................. 324/158.1, 765, 324/754, 755; 714/724, 738; 326/30

(56) References Cited

U.S. PATENT DOCUMENTS

| | | | |
|---|---|---|---|
| 4,362,394 A | 12/1982 | Menlove | |
| 4,492,918 A | 1/1985 | Henandez et al. | |
| 4,523,312 A | 6/1985 | Takeuchi | |
| 4,640,134 A | 2/1987 | Simmons | |
| 4,646,299 A | 2/1987 | Shinabeck et al. | |
| 4,792,932 A | 12/1988 | Bowhers et al. | |
| 4,827,437 A | 5/1989 | Blanton | |
| 4,908,576 A | 3/1990 | Jackson | |
| 5,682,337 A | 10/1997 | El-Fishawy et al. | |
| 5,682,472 A | 10/1997 | Brehm et al. | |
| 5,794,175 A | 8/1998 | Conner | |
| 6,133,725 A | 10/2000 | Bowhers | |
| 6,292,415 B1 | 9/2001 | Brehm | |
| 6,331,783 B1 | 12/2001 | Hauptman | |
| 6,563,298 B1 * | 5/2003 | Creek | 324/158.1 |

OTHER PUBLICATIONS

Motorola, Inc., MC10194 Dual Simultaneous Bus Transceiver, data sheet (prior to Aug. 15, 2000).
M606 User's Manual, Section 1, published by Teradyne, Inc. (Jun. 1985).
Hewlett Packard, Time Interval Calibrator, HP Model 59992A J06, Technical Data (Mar. 1996).

* cited by examiner

Primary Examiner—John E. Chapman
Assistant Examiner—James Kerveros
(74) Attorney, Agent, or Firm—Blakely, Sokoloff, Taylor & Zafman LLP (57) ABSTRACT

An apparatus to receive a response signal sent from a device under test. The apparatus includes pin electronics to identify a response signal contained in a composite signal. The composite signal is a composite, or sum, of the response signal and a test signal. The pin electronics has a driver to send the test signal to the device under test, and a receiver to receive the composite signal and to separate the response signal from the composite signal.

17 Claims, 7 Drawing Sheets

SEPARATING DEVICE RESPONSE SIGNALS FROM COMPOSITE SIGNALS

The present application claims priority from and is a divisional application of U.S. patent application Ser. No. 09/639,517 filed Aug. 15, 2000, now U.S. Pat. No. 6,563,298, which is owned by the same assignee as the present patent application.

FIELD OF INVENTION

The present invention relates to the field of signal analysis, and more particularly, to identifying signals received from a device under test in an automatic test equipment (ATE) system.

BACKGROUND OF THE INVENTION

Integrated circuits (ICs), after being fabricated, are typically tested on ATE systems before being shipped to customers. Devices not passing certain tests are typically discarded and not shipped. The ATE can also be used to simply learn the characteristics of a particular device under test (DUT). One type of ATE system includes a test head with a socket to hold the DUT.

Figure 1:
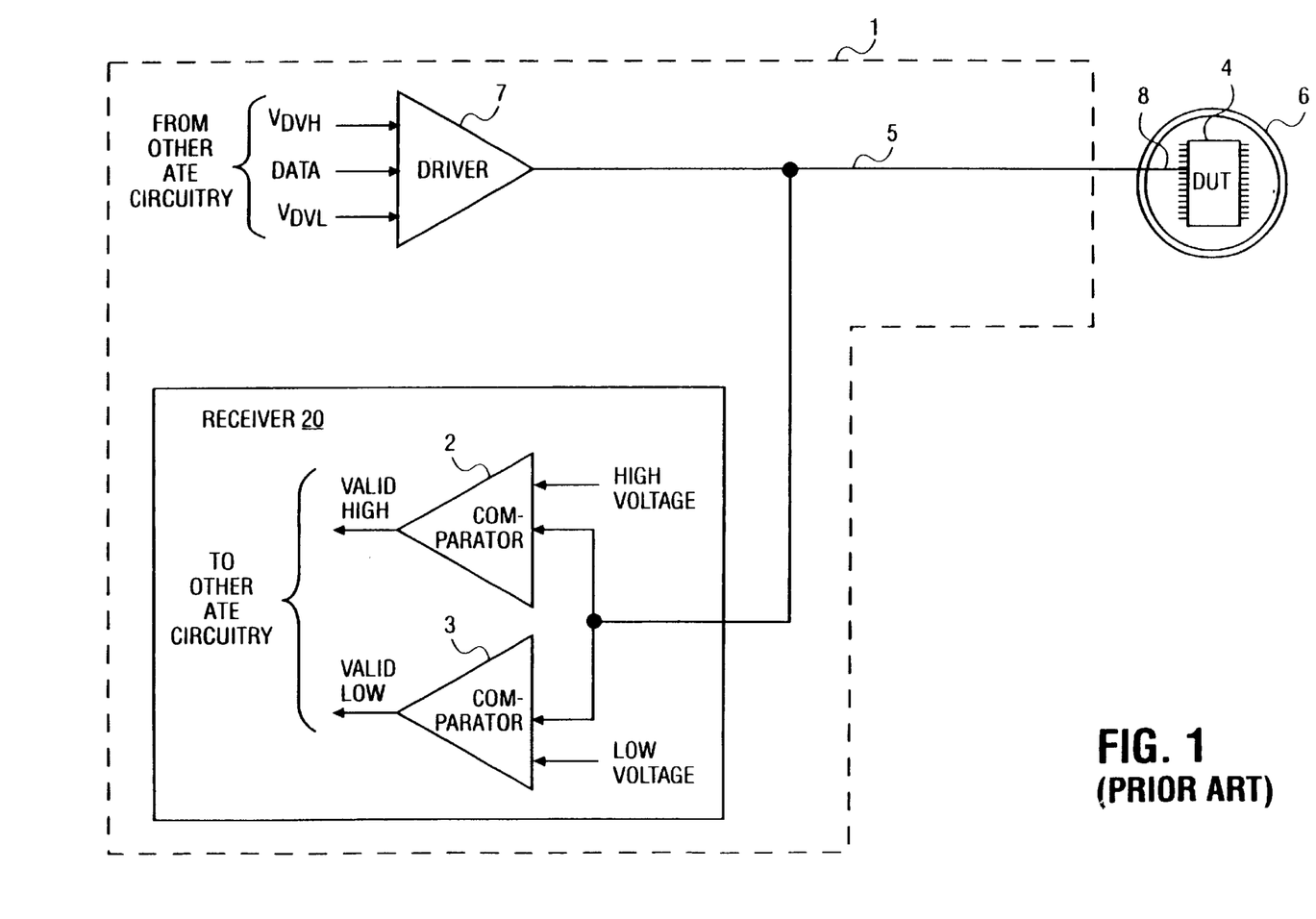
FIG. 1 illustrates a conventional ATE circuit coupled to a DUT circuit through a transmission path.

FIG. 1 illustrates a conventional ATE circuit coupled to a DUT circuit through a transmission path. The ATE circuit includes test driver 7 and receiver 20. Circuitry identical to driver and receiver circuitry 1 is included for each pin of DUT 4 plugged into socket 6. Driver and receiver circuitry 1 is used to transfer signals between the rest of the ATE and pin 8 of DUT 4.

Circuitry 1 includes a driver 7 for sending test signals to pin 8 of DUT 4 over transmission path 5. The ATE receiver 20 is typically one or more comparators with programmable reference levels. For example, ATE receiver 20 typically includes a valid logic low comparator 3 and a valid logic high comparator 2 coupled to path 5 for receiving signals from DUT 4. Comparator 2 is coupled to a reference high voltage, also referred to as a preset high voltage. Comparator 3 is coupled to a reference low voltage, also referred to as a preset low voltage. Comparators 2 and 3 allow the ATE to sense whether pin 8 of DUT 4 is providing a valid logic high and a valid logic low signal, respectively.

Transmission path 5 acts like a bidirectional transmission line with a characteristic impedance Zo. The ATE driver typically has an output impedance that matches the impedance of the transmission line 5 that is used to connect the DUT and the ATE circuit.

The DUT 4 includes a receiver (not shown) to receive the test signals, and a driver (not shown) to send back response signals to the ATE in response to the test signals sent from the ATE to the DUT. The DUT driver typically has an output impedance that varies as a function of process variations and, for high-speed devices, is usually lower than the impedance of the tester circuit. Thus, driver and receiver circuitry 1 is used by the ATE to send and receive signals from DUT 4.

Figure 2:
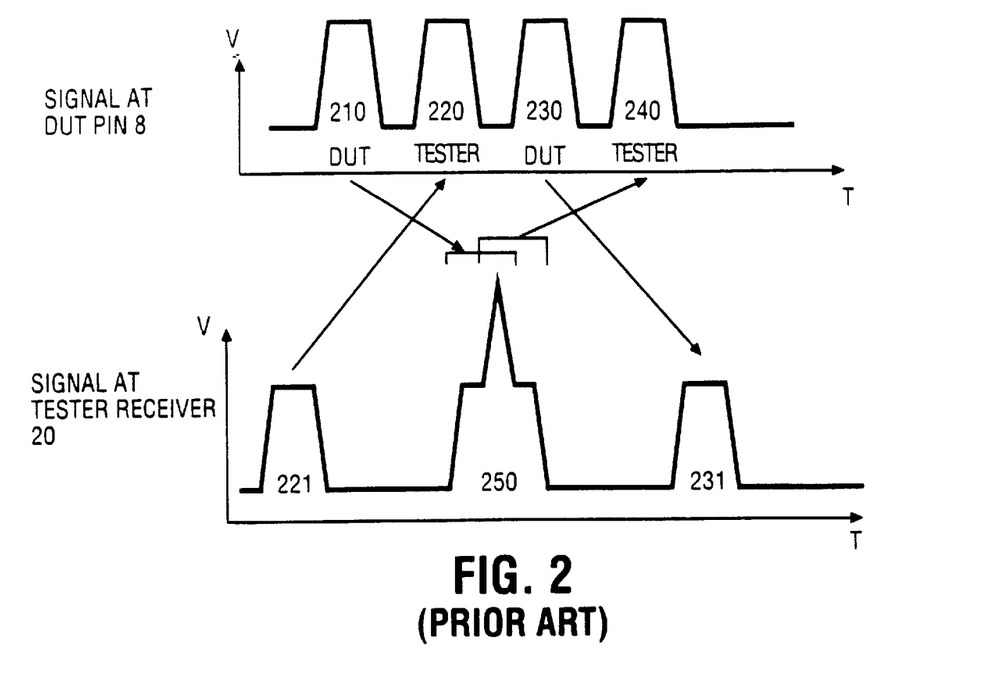
FIG. 2 shows example waveforms from a conventional ATE having a transmission line with a 2.5 nano-second (nS) transmission length.

The problem with testing high frequency ICs using conventional ATE in electronics is that the response signal that the DUT sends down the transmission path to the ATE does not arrive at the ATE before the ATE launches the next test signal for the DUT to receive. Because of this, the signal at the ATE is a composite of the ATE driver test signal and the DUT response signal, as shown in FIG. 2. Conventional ATEs cannot identify the response signal that is needed to evaluate the DUT, because the response signal is lost in the composite signal.

FIG. 2 shows example waveforms from a conventional ATE having a transmission line with a 2.5 nano-second (nS) transmission length. The signals have 1 nS positive and negative pulse widths. The DUT is sending response signals 210 and 230 in the first and third cycles, and the ATE is driving test signals 220 and 240 in the second and fourth cycles. The test signals 220 and 240 sent by the ATE take 2.5 nS to travel the length of the transmission path and reach the DUT. Similarly, the response signals 210 and 230 from the DUT arrive at the ATE 2.5 nS after they leave the DUT. Thus, test signal 220 received by the DUT is test signal 221 sent by the ATE and time-shifted by 2.5 nS. Similarly, the response signal 231 received by the ATE is signal 230 sent by the DUT shifted by 2.5 nS.

These opposing time shifts mean that the DUT response signal can be received at the same time that a test signal is being sent from the ATE driver. When these signals overlap, they add together to create a composite signal 250 at the ATE receiver 20 as shown in FIG. 2. The composite signal which is a sum of signal 210 and signal 240, bears little resemblance to the response signal sent from the DUT pin 8.

Figure 3:
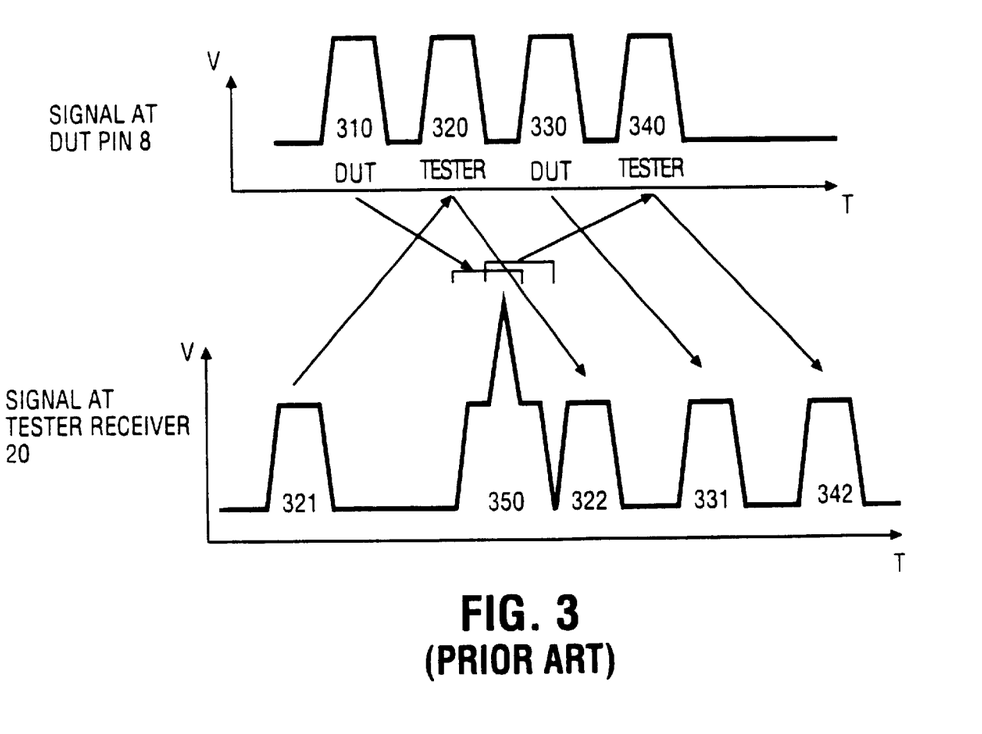
FIG. 3 shows example waveforms from a conventional ATE including reflected signals.

In this example, the ATE driver 7 and the DUT driver (not shown) are left on at all times, and they both have an output impedance that matches the impedance of the transmission line. In this case, the transmission line 5 is always terminated so there are no reflections. However, the problem caused by overlapping signals becomes exacerbated when the output impedance of a DUT driver does not match the impedance of the transmission line, as shown in FIG. 3.

Typically, a DUT driver turns off (goes to a high impedance state) to avoid driver contention when the ATE is driving. Therefore, when the test signal reaches the DUT, the test signal is reflected back over the transmission line to the ATE. FIG. 3 shows example of waveforms including reflected test signals from a conventional ATE coupled to a DUT having a lower impedance than the transmission line. Because the test signal 320 that the ATE generates is not terminated by the DUT, the test signal 322 reflects back down the transmission path and is received by the ATE receiver 2.5 nS later. In this case, the ATE receiver 20 receives a composite signal, along with signals 320, 340 and reflected signals 322 and 342. Conventional ATE systems cannot separate the response signal from the composite signal.

The ideal way to solve the problem caused by a composite signal is to design an ATE system with a transmission path that has an electrical length shorter than one half of the response time of the DUT. DUT response times are already at 1 nS and are expected to be much faster. However, designing ATE test systems with transmission paths less than 500 picoseconds (pS) for a large number of DUT pins has proven to be impractical. Conventional ATE systems use transmission lines that have transmissions lengths greater than or equal to 2 nS.

As a result, the most common method of testing a DUT with a fast response time is to test the DUT at a lower frequency, then assume that the DUT operates correctly at higher frequencies. However, this method of testing at lower frequencies does not necessarily detect all DUT process errors.

Another conventional way to work around the problem of a composite signal is to use a technique known as "fly-by". This technique uses separate drive and receive transmission paths between the ATE and the DUT. Both paths are terminated with the characteristic impedance of the transmission line (typically 50 Ohms). The signal at the ATE receiver is the same as the signal on the DUT pin except that it is time delayed.

The main disadvantage of the "fly-by" technique is that more test resources are required. There are usually two ATE circuits and two transmission paths required for each DUT pin that requires high-speed input/output (I/O) testing. A second disadvantage of this technique is that the DUT must drive two transmission lines in parallel. This requires the DUT's output circuitry to drive enough current to do this even though the DUT may not be required to drive that amount of current in the intended final application.

It is also possible, in limited cases, to get around the problem of a composite signal by expecting a DUT to have a low enough output impedance to overdrive the ATE circuit. The ATE circuit can then determine the logic state of the DUT driver within a narrow band of compare logic levels.

However, the exact time that the DUT response signal transitions from one logic state to the other can be influenced by the ATE test signal. This influence can be on the same order of magnitude as the transition time of the ATE driver, which is several hundred pico-seconds on conventional ATE testers. As a result, this influence causes timing uncertainty that is greater than the specified timing accuracy of many high frequency DUTs.

SUMMARY OF THE INVENTION

An apparatus to receive a response signal from a device is disclosed. In one embodiment, the apparatus includes a driver to send a first signal to the device, and a receiver to receive a composite signal from the device. The composite signal includes the response signal and the first signal. The receiver separates the response signal from the composite signal.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

An apparatus and method to separate a response signal from a composite signal is disclosed. In one embodiment, the apparatus includes pin electronics to identify a response signal contained in a composite signal. The composite signal is a composite, or sum, of the response signal and a test signal. The pin electronics has a driver to send the test signal to the device under test, and a receiver to receive the composite signal and to separate the response signal from the composite signal.

Separating the response signal from the composite signal allows the testing of DUT input/output terminals that switch from receiving to driving in a period of time that is less than the time to traverse the electrical length of the path from the DUT terminal to the testing circuit.

Another intended advantage of separating a response signal from a composite sum of the test and response signals is that the ATE can examine a DUT response signal that is the same as the response signal initially sent by the DUT (except for a time shift), without having to add additional device loading or ATE resources, such as additional circuitry.

Another intended advantage is enabling the testing of any IC that has numerous digital I/O pins running faster than, for example, 200 MHz, including an IC that accesses memory through a high speed bus.

The apparatus and method to separate a response signal from composite signal can be used by an electronic tester to analyze the response signals of a device under test and to evaluate the performance of the device under test. An electronic tester 400 that includes interface circuit 435 that can separate a response signal from a composite signal is shown in FIG. 4.

Figure 4:
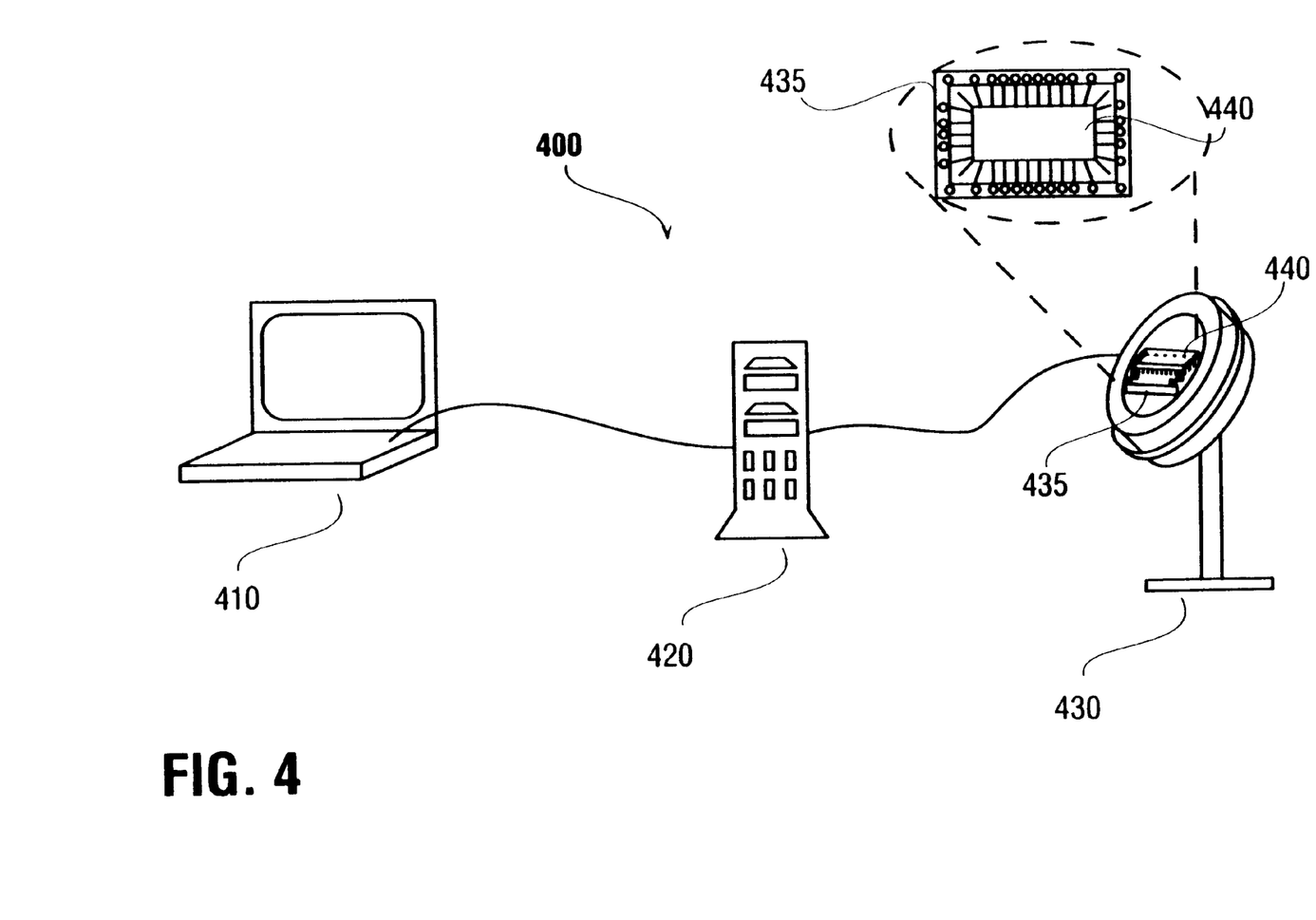
FIG. 4 is a block diagram of an ATE system to test an IC, where the ATE system includes subtractor circuitry to separate a response signal from a composite signal.

FIG. 4 shows one embodiment of a test circuit system. In particular, ATE test system 400 shows computer 410 coupled to diagnostic system 420. Diagnostic system 420, in turn, is coupled to testing base 430. Testing base 430 is used to orient and couple the pins of device under test ("DUT") 440 to interface circuit 435. Interface circuit 435 includes circuitry 511 to separate a response signal from a composite signal, as discussed below.

As illustrated in FIG. 4, testing base 430 provides a platform that allows interface circuit 435 to directly connect to the pins of DUT 440. For one embodiment, interface circuit 435 includes two components. The first component includes drive circuits (not shown) used to drive DUT 440's input pins. The second component includes offsettable differential comparators (not shown) used to read DUT 440's output pins. Using interface circuit 435, test system 400 determines the input/output ("I/O") characteristics of DUG 440.

For one embodiment, computer 410 generates test vectors. The test vectors include a set of inputs used to exercise the logic included in DUT 440. The test vectors also include a set of expected outputs. The excepted outputs represent a desired output based on selected input values. Using the test vectors, test system 400 examines the I/O characteristics of DUT 440. In particular, diagnostic system 420 calibrates the input test vectors, via interface circuit 435, and applies the calibrated input signals to the input pins of DUT 440. Diagnostic system 420 also reads the output pins of DUT 440 via interface circuit 435. Subsequent to reading the DUT's output values, diagnostic system 420 compares the values on the output pins to the excepted vector outputs.

System 400 compares the values generated by DUT 440 versus the expected outputs during a given time period. Accordingly, system 400 determines the timing specification of DUT 440's outputs. For one embodiment, DUT 440 comprises a digital microprocessor. For alternative embodiments, DUT 440 comprises mixed signal communication integrated circuits.

For one embodiment, test system 400 is coupled to a DUT with differential outputs. Accordingly, interface circuit 435 includes offsettable differential comparators to read the DUT's output pins. Each differential output of the DUT is coupled to a single offsettable differential comparator. For an alternative embodiment, multiple differential outputs of the DUT are coupled to a single offsettable differential comparator through a multiplexing device that selects a particular DUT output for testing.

Figure 5:
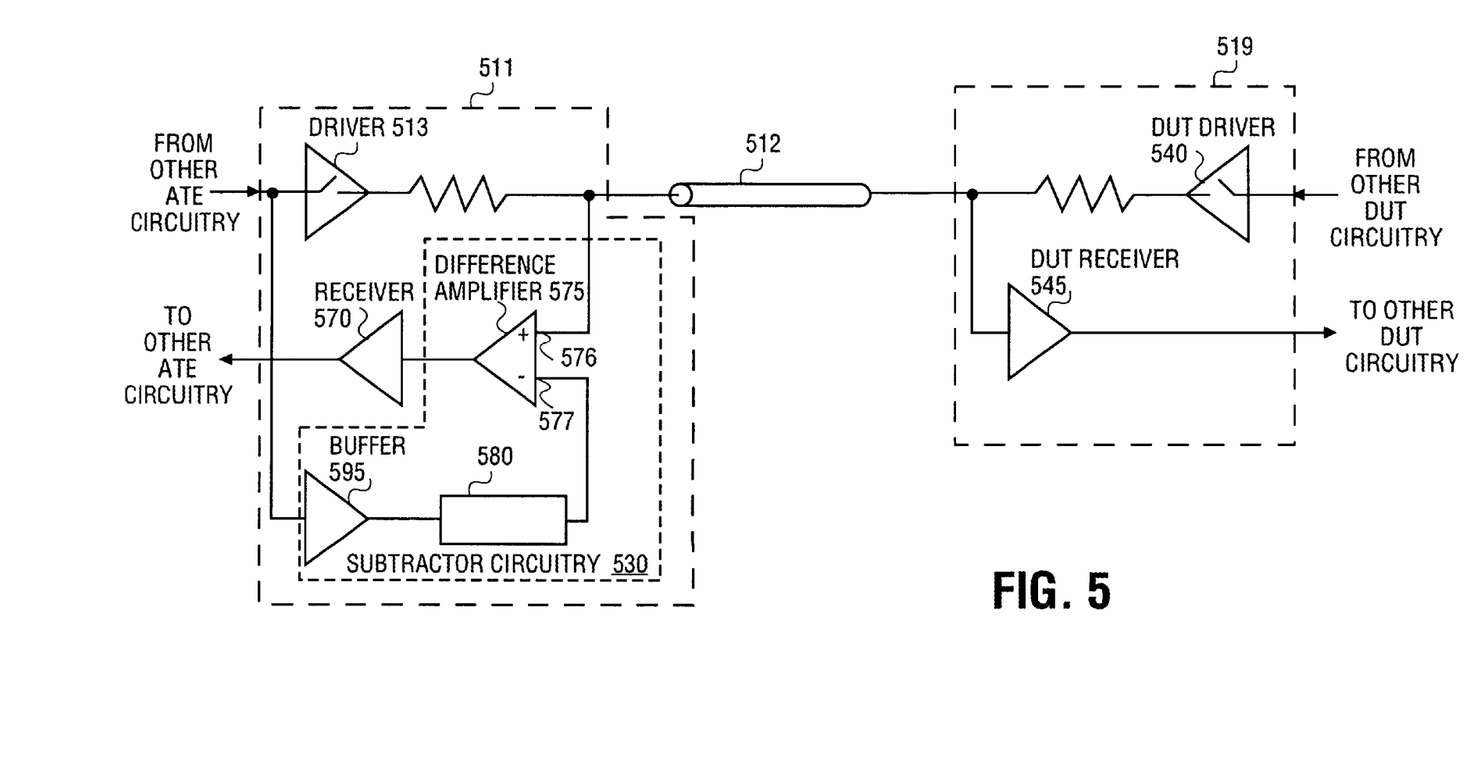
FIG. 5 is an embodiment of an apparatus that includes subtractor circuitry to separate a response signal from a composite signal.

FIG. 5 illustrates driver and receiver circuitry 511 for interface circuitry 435 of system 400. The driver and receiver circuitry 511 includes subtractor circuitry 530 to separate a response signal from a composite signal. The DUT 440 is plugged into a socket of testing base 430. One pin 519 of the DUT is coupled to driver and receiver circuitry 511 by transmission line 512 as shown in FIG. 5. The testing base 430 includes other sets of pin electronics (not shown) for the other pins of DUT 440. Each of those other sets of pin electronics include the same driver and receiver circuitry 511 as shown in FIG. 5.

Driver and receiver circuitry 511 includes driver 513, receiver 570, and transmission path 512. Transmission path 512 couples pin 519 of the DUT, driver 513 and receiver 570. Driver 513 and receiver 570 are in turn coupled to other circuitry (not shown) of the ATE system. The receiver may include one or more comparators (not shown).

Transmission path 512 has the characteristics of and acts like a bidirectional transmission line with a characteristic impedance of Zo. In one embodiment, impedance Zo is approximately 50 ohms.

Driver 513 applies input test signals to pin 519 of DUT 440 via transmission path 512. Driver 513 is enabled by the ATE system. DUT receiver 545 receives the test signal from the transmission line 512 and provides the test signal to other DUT circuitry (not shown). The DUT generates a response to the test signal. The DUT driver 540 applies the DUT response signal to the transmission line 512, so that the response signal can be received by the ATE system.

The output of receiver 570 is coupled to other circuitry of the ATE system. The ATE system reads the output of receiver 570 to decide if the response signals of DUT meet or do not meet the specifications for DUT 440. The ATE system can then judge whether or not DUT 440 is defective. Alternatively, the ATE system can use the output of receiver 570 to learn the characteristics of DUT 4.

The driver and receiver circuitry 511 further includes subtractor circuitry 530 to subtract the test signal sent by the driver 513 from the composite signal on the transmission line 512 that is input to the receiver 570. Because the composite signal includes the sum of the DUT response signal plus the test signal, subtracting the test signal from the composite signal leaves only the DUT response signal. Therefore, the subtractor circuitry 530 includes a difference amplifier 575 that has two inputs. One of the inputs 576 of difference amplifier 575 receives the composite signal from transmission line 512 that includes the sum of the test signal sent by the driver, and the response sent by the DUT. Another input 577 receives the test signal sent by driver 513.

When the driver 513 is connected to the transmission line 512, the test signal is attenuated by a factor of 2, or 6 decibels (dB), by the driver output impedance and the characteristic impedance of the transmission line. Therefore, the test signal that is input to difference amplifier 575 has been attenuated 6 dB by attenuator 580, so that the attenuation of the test signal on input 577 matches the attenuation of the test signal that forms a part of the composite signal on transmission line 512. Buffer 595 is used to input the test signal to the attenuator 580. Buffer 595 has propagation delays and edge characteristics that match those of driver 513. In one embodiment, matching is accomplished by fabricating the buffer and driver on the same wafer.

Figure 6:
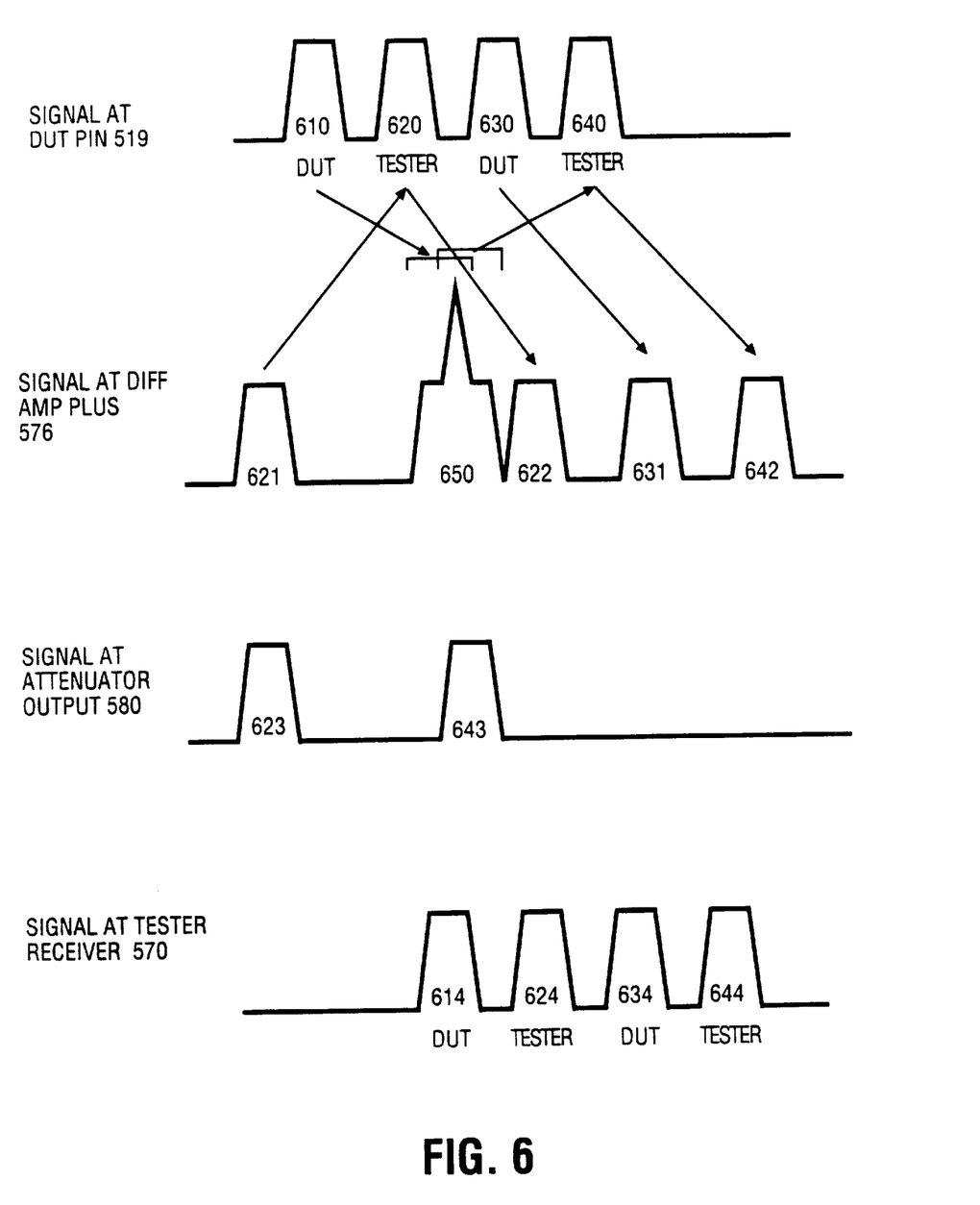
FIG. 6 shows example waveforms that are input to and output from an apparatus to separate a response signal from a composite signal.

FIG. 6 shows the result of applying to the test case the composite signals to subtractor circuitry 530. At the receiver 570, the response signals 614 and 634, and the reflected signals 624 and 644 are the result of subtracting the attenuated test signals 623 and 643 from the composite signal. The resultant response signals 614 and 634 are the same as the signals 610 and 630 sent by the DUT pin, except that they are time shifted 2.5 nS.

The reflected test signals 624 and 644 shown in FIG. 6 are present when the DUT turns off, or when the DUT driver 540 has a different output impedance than the transmission path. The signals 624 and 644 that are reflections of the test signals sent by the driver 513 can, therefore, vary as a result of the DUT characteristics. An analysis of the pulses 624 and 644 can be used to determine whether the DUT driver 540 was on or off, and to determine the output impedance of the DUT.

However, if the DUT driver 540 does not turn off and it has an output impedance equal to that of the transmission path, there is no reflection of the test signals, and reflection pulses 622 and 642 are not present. Therefore, pulses 624 and 644 are not present at the tester receiver 570.

The DUT pulses 610 and 630, as seen by the ATE receiver 570, are the same as the response pulses 614 and 634 at the DUT pin 519, except that they are time shifted.

In an alternative embodiment, an attenuated test signal from the driver is injected into the reference voltage of the receiver in order to perform the driver swing subtraction. In another alternative embodiment, a method for separating the response signal from the composite signal can be used with tri-level driver modes or analog signals.

Figure 7:
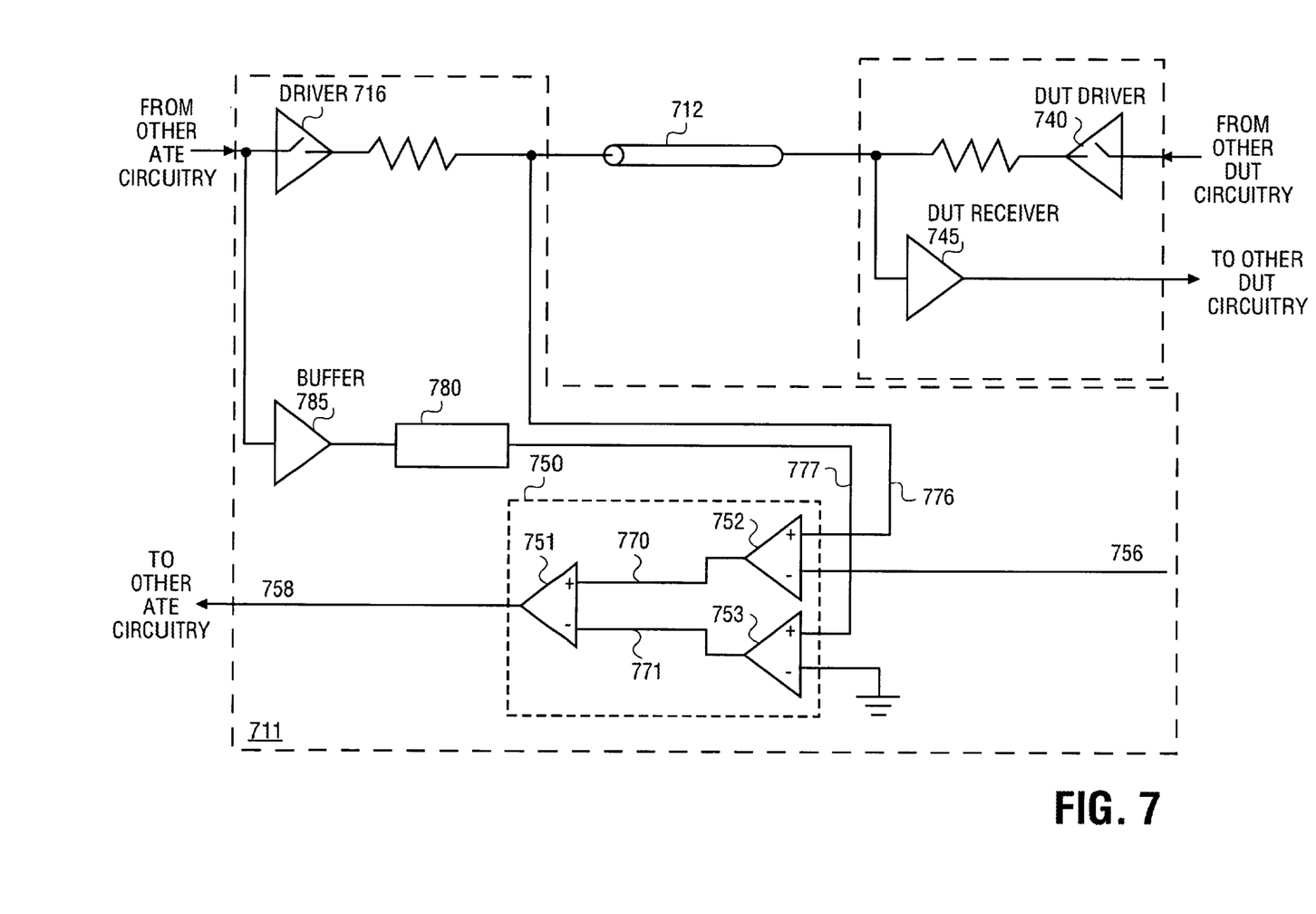
FIG. 7 shows one embodiment of an offsettable differential comparator that may be used by the difference amplifier of FIG. 5.

In one embodiment shown in FIG. 7, an offsettable differential comparator 750 is used to form a difference amplifier and receiver, which may be used as difference amplifier 575 as shown in FIG. 5.

Difference amplifier 752 subtracts the reference voltage 756 from the composite signal 776. In one embodiment, amplifiers 752 and 753 have gains of approximately one; therefore the voltage at node 770 is 776–756. Similarly, the voltage at node 771 is 777-OV.

The signal at nodes 770 and 771 are compared to each other by comparator 751. If node 770 is higher than node 771 at a given point in time the output 758 will be a logic one otherwise output 758 will be logic zero.

Therefore, if (776–756)–(777) is greater than OV, output 758 will be a logic one. This action subtracts the reference signal 777 from the composite signal 776 and compares it against the programmable reference voltage 756.

Figure 8:
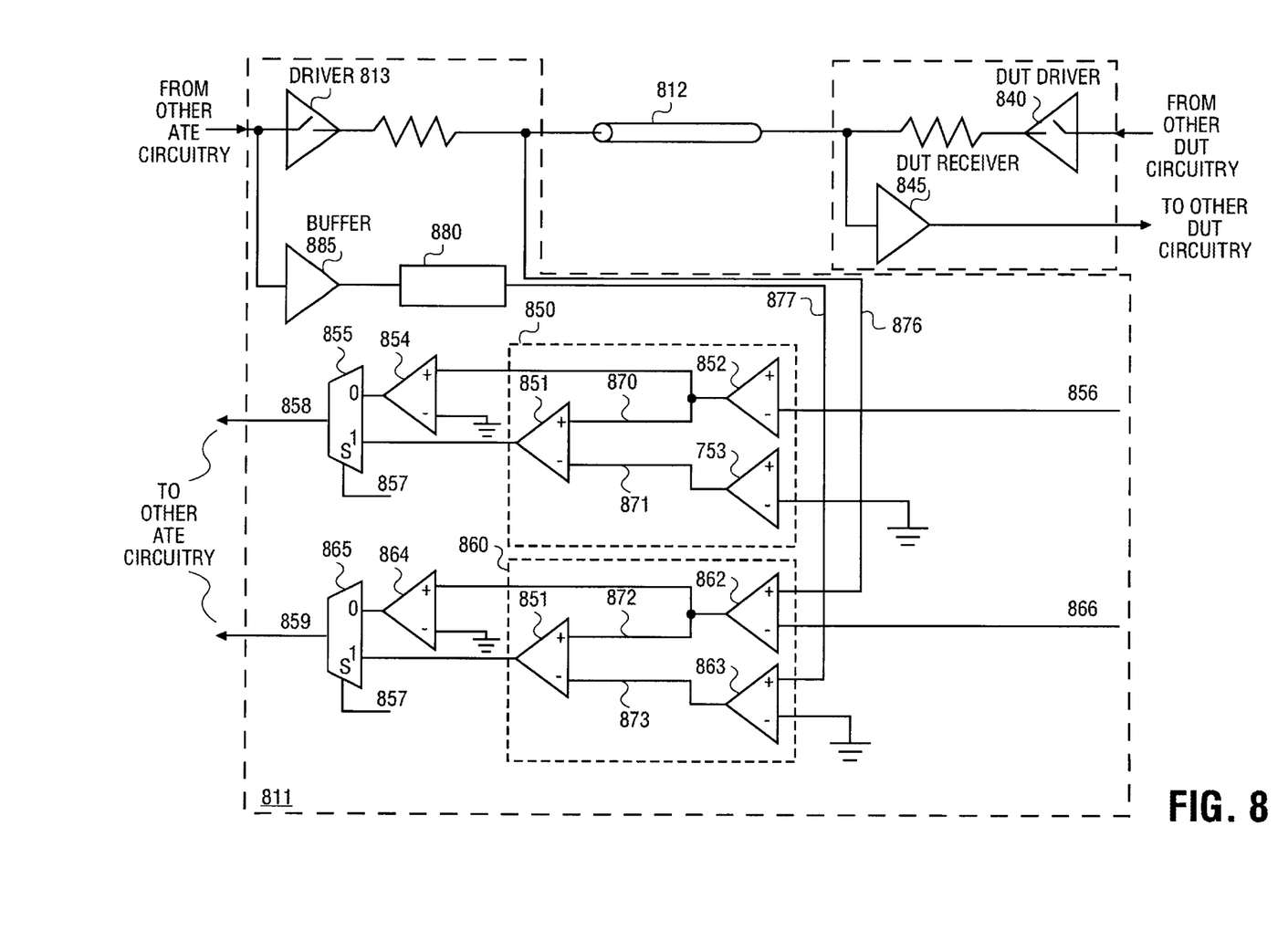
FIG. 8 shows another embodiment of an offsettable differential comparator.

Difference amplifiers 752 and 753 should be well matched for steady-state and transient response in order to give the overall circuit good common-mode rejection. In one embodiment, each ATE pin electronics circuit may have a plurality of comparators, therefore FIG. 8 shows two offsettable differential comparators. In one embodiment, these comparators connect to the other ATE circuitry as high and low comparators.

Multiplexers 855 and 865 and comparators 854 and 864 are shown in FIG. 8. When the select line 857 is a logic low, the multiplexer 855 selects the output of comparator 854. With this selection, the output 858 will be a logic high if the composite signal 876 is higher than the reference 856. When the select line 857 is a logic high, the output of comparator 851 is selected and the circuit behaves the same as the circuit in FIG. 7.

For alternative embodiments, the subtractor circuitry 530 of driver and receiver circuitry 511 can be outside of the arena of automatic test equipment. For example, the device need not be limited to a device under test. The signal sent to the device need not be limited to a test signal.

These and other embodiments of the present invention may be realized in accordance with these teachings and it should be evident that various modifications and changes may be made in these teachings without departing from the broader spirit and scope of the invention. The specification and drawings are, accordingly, to be regarded in an illustrative rather than restrictive sense and the invention measured only in terms of the claims.

What is claimed is:

1. An automatic test system comprising:
   a test head to hold a device under test;
   an electronic tester to generate test signals to send to the device under test and to analyze response signals from the device under test; and
   a pin electronics card comprising:
      a first driver having an input and an output, the input to receive a test signal, the output suitable to be coupled to a transmission line, the output coupled to a node;
      a second driver having an input and an output, the input coupled to the input of the first driver to receive the test signal;
      a receiver having a first input, a second input and an output, the first input coupled to the node, the second input coupled to the output of the second driver, the receiver to subtract a signal received from the output of the second driver from a signal received from the node.

2. The automatic test system of claim 1, wherein the pin electronics card further comprises:
   an attenuator circuit having an input and an output, the attenuator circuit interposed between the second driver and the receiver, the input of the attenuator circuit coupled to the output of the second driver, the output of the attenuator circuit coupled to the second input of the receiver.

3. The automatic test system of claim 2, wherein the attenuator circuit includes a resistive divider network.

4. The automatic test system of claim 2, wherein the attenuator circuit includes an attenuator.

5. The automatic test system of claim 2, wherein the node is coupled to a transmission line.

6. The automatic test system of claim 5, wherein the transmission line has an attenuation and the attenuator circuit includes an attenuator having an attenuation substantially equal to the attenuation of the transmission line.

7. The automatic test system of claim 2, wherein the receiver includes:
   a first amplifier having a first input coupled to the node, a second input coupled to a programmable reference voltage and an output;
   a second amplifier having a first input coupled to the output of the attenuator circuit, a second input coupled to ground, and an output;
   a comparator having a first input connected to the output of the first amplifier and a second input coupled to the output of the second amplifier, and an output, the output of the receiver being the output of the comparator.

8. The automatic test system of claim 7 wherein the first amplifier has a unity gain and the second amplifier has a unity gain.

9. The automatic test system of claim 2 wherein the receiver includes:
   an amplifier having a first input coupled to the node, a second input coupled to the output of the attenuator circuit and an output, the first input of the amplifier being the first input of the receiver, the second input of the amplifier being the second input of the receiver, the output of the amplifier being the output of the receiver.

10. The automatic test system of claim 9 wherein the first input of the amplifier is a positive input, the second input of the amplifier is a negative input, and the amplifier has a unity gain.

11. The automatic test system of claim 9 wherein the first input of the amplifier is a negative input, the second input of the amplifier is a positive input, and the amplifier has a unity gain.

12. The automatic test system of claim 9 wherein the first driver and the second driver have substantially similar electrical characteristics.

13. The automatic test system of claim 2 wherein the first driver and the second driver have substantially similar electrical characteristics.

14. The automatic test system of claim 1 wherein the pin electronics card further comprises:
   a series resistor having a first terminal and a second terminal, the first terminal coupled to the output of the first driver, and the second terminal coupled to the node.

15. An automatic test system comprising:
   a test head to hold a device under test;
   an electronic tester to generate test signals to send to the device under test and to analyze response signals from the device under test; and
   a pin electronics card comprising:
      first means for driving a signal to a device, the first means having an input and an output, the input for receiving a test signal, the output for driving a first signal responsive to the test signal;
      second means for driving a signal, the second means having an input and an output, the input for receiving the test signal, the output for driving a second signal responsive to the test signal; and
      receiving means for receiving a responsive signal and the second signal, the receiving means also for subtracting the responsive signal from the second signal, the responsive signal to be received from a device under test.

16. The automatic test system of claim 15 wherein the pin electronics card further comprises:
   means for attenuating an input signal into an output signal, the means for attenuating interposed between the second means for driving and the receiving means, the means for attenuating having an input coupled to the output of the second means for driving and the means for attenuating having an output coupled to the receiving means, the means for attenuating for attenuating the second signal.

17. The automatic test system of claim 16 wherein the first means for driving and the second means for driving have substantially similar characteristics.

* * * * *